(12) United States Patent
Shimada

(10) Patent No.: US 7,602,877 B2
(45) Date of Patent: Oct. 13, 2009

(54) FREQUENCY DIVIDER AND METHOD FOR CONTROLLING THE SAME

(75) Inventor: Mikihiro Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 80 days.

(21) Appl. No.: 11/768,333

(22) Filed: Jun. 26, 2007

(65) Prior Publication Data
US 2008/0068053 A1    Mar. 20, 2008

(30) Foreign Application Priority Data
Jun. 26, 2006 (JP) ............... 2006-175931

(51) Int. Cl.
*H03K 21/00* (2006.01)
(52) U.S. Cl. ............... 377/47; 377/48; 327/115; 327/117
(58) Field of Classification Search ............... 377/47, 377/48; 327/218, 115, 117
See application file for complete search history.

(56) References Cited
U.S. PATENT DOCUMENTS

| | | | | |
|---|---|---|---|---|
| 5,754,615 A | * | 5/1998 | Colavin | ............... 377/47 |
| 6,356,123 B1 | * | 3/2002 | Lee et al. | ............... 327/115 |
| 7,109,762 B2 | * | 9/2006 | Neurauter et al. | ........... 327/115 |
| 7,459,948 B2 | * | 12/2008 | Seethamraju | ............... 327/117 |
| 2003/0034810 A1 | * | 2/2003 | Trivedi et al. | ............... 327/115 |
| 2006/0181316 A1 | * | 8/2006 | Miller | ............... 327/115 |
| 2007/0103217 A1 | * | 5/2007 | Frederick et al. | ............ 327/218 |

FOREIGN PATENT DOCUMENTS

| | | |
|---|---|---|
| JP | 63-018721 | 1/1988 |
| JP | 63-244931 | 10/1988 |

\* cited by examiner

*Primary Examiner*—Tuan Lam
(74) *Attorney, Agent, or Firm*—RatnerPrestia

(57) ABSTRACT

A frequency divider in accordance with the present invention includes a plurality of latch circuits connected together in series to which a clock signal and an inversion clock signal are input, an inverter circuit to which an output signal from a last connected one of the latch circuits is input, an output terminal to which an output from the inverter circuit is connected, and a plurality of feedback paths that connect the output from the inverter circuit to respective inputs of the plurality of latch circuits. The frequency divider further includes a switching circuit that switches connections to the plurality of feedback paths so that an output signal from the inverter circuit is input to only one of the plurality of latch circuits.

5 Claims, 8 Drawing Sheets

11 First latch circuit
12 Switching circuit
13 Second latch circuit
14 First feedback path
15 Second feedback path
16 Inverter circuit
17 Clock input section
18 Inversion clock input section
19 Output section 11 First latch circuit
12 Switching circuit
13 Second latch circuit
14 First feedback path
15 Second feedback path
16 Inverter circuit
17 Clock input section
18 Inversion clock input section
19 Output section 20 Switching circuit
21 First latch circuit
22 Second latch circuit
23 Third latch circuit
24 First feedback path
25 Second feedback path
26 Third feedback path
27 Inverter circuit 51 First latch circuit
52 Switching circuit
53 Second latch circuit
54 First feedback path
55 Second latch circuit output path
56 Second feedback path
57 Inverter circuit
58 Clock input section
59 Inversion clock input section
60 Output section 70 First latch circuit
71 Second latch circuit
72 Third latch circuit
73 First switching circuit
74 Second switching circuit
75 First feedback path
76 Second feedback path
77 Third feedback path
78 Inverter circuit 81 First frequency dividing circuit
82 Second frequency dividing circuit
83 Switching circuit
84 Input terminal
85 Output terminal 90 Switch
91, 92, 93 Master slave flip flop
94 OR gate
95 Control signal

FREQUENCY DIVIDER AND METHOD FOR CONTROLLING THE SAME

BACKGROUND OF THE INVENTION

1. Field of the Invention

The present invention relates to a frequency divider and a method for controlling the frequency divider. The present invention relates to a frequency divider, for example, for use in radio communication apparatuses such as cellular phones, and a method for controlling the frequency divider.

2. Related Art of the Invention

In recent years, radio communication systems have been commonly used in public communications, computer networks, and the like. Further, the use of a system has been started which has a reduced number of oscillators for a reduction in the size and cost of high frequency ICs, and frequency dividers connected behind the oscillators and having different frequency dividing ratios in order to deal with a plurality of transmission frequencies.

Some conventional techniques implement switching of the frequency dividing ratio by connecting a plurality of frequency division circuits in series and switching a path for output signals (see, for example, Patent Document 1: Japanese Patent Laid-Open No. 63-18721 (for example, FIG. 1)).

FIG. 8 shows a circuit diagram illustrating the basic concept of the conventional frequency divider described in Patent Document 1.

The circuit is configured so that a first frequency dividing circuit 81 and a second frequency dividing circuit 82 are connected together in series so as to allow an output from the frequency dividing circuits to be output as a frequency dividing signal via a switching circuit 83. The first frequency dividing circuit 81 divides the frequency of an input signal by M and outputs the resulting signals. The signals obtained by the first frequency dividing circuit 81 by dividing the frequency of the input signal by M are input to the second frequency dividing circuit 82, which further divides the frequency of each of the signals by N and outputs the resulting signals.

As shown by a solid line in the switching circuit 83 in FIG. 8, if the output of the second frequency dividing circuit 82 is connected to an output terminal 85, the output terminals 85 outputs an output signal of the second frequency dividing circuit 82, that is, Vb obtained by dividing an input signal from an input terminal 84 by (M×N).

To obtain an output signal Va with a frequency dividing ratio different from that of the output signal Vb while the output signal Vb is being output from the output terminal 85 as described above, a control signal Vc switches the connection in the switching circuit 83 as shown by a dotted line, while simultaneously blocking a current source for the second frequency dividing circuit 82.

Thus switching the connection in the switching circuit 83 makes the frequency dividing circuit 82 inoperative and simultaneously reduces power consumption. That is, the control signal Vc serves both as a switching control signal and as a power supply blocking control signal. A given timing correlation can be considered to be simultaneous.

The output signals Va output by the first frequency dividing circuit 81 and obtained by dividing the frequency of the input signal by M are output from the output terminal 85 via the switching circuit 83.

In the prior art, connection paths to the plurality of frequency dividing circuits are switched to allow the output signals Va and Vb with the different frequency dividing ratios to be output.

Further, in a similar configuration, a fixed frequency divider or a variable frequency divider is provided by providing a switch function between the output and input of a master slave flip flop so as to vary the number of stages of a feedback loop (see, for example, Patent Document 2: Japanese Patent Laid-Open No. 63-244931 (for example, FIG. 1)).

FIG. 9 shows a circuit diagram of the frequency divider described in Patent Document 2.

Three master slave flip flops 91, 92, 93 are connected in series. A switch 90 switches connection paths to the flip flops 91, 92, 93. Each of the master slave flip flops 91, 92, 93 is a frequency dividing circuit that divides the frequency of an input signal by two and outputs the resulting signals.

An OR gate 94 generates a signal from both an output signal from the master slave flip flop 92 and a control signal 95, and this signal switches the connection in the switch 90.

As shown by a solid line in the switch 90 in FIG. 9, if connections are made so that an output from the master slave flip flop 93 is input to the master slave flip flop 92, the configuration of the master slave flip flops 92 and 93 serves to divide the frequency of a clock signal by four and to output the resulting signals.

With the master slave flip flops 92 and 93 thus connected, switching the connection in the switch 90 as shown by a dotted line causes an output from the master slave flip flop 91 to be input to the master slave flip flop 92. In this case, the configuration of the master slave flip flops 91, 92, and 93 serves to divide the frequency of a clock signal by eight and to output the resulting signals.

As described above, also with the frequency divider described in Patent Document 2, the path between the plurality of frequency dividing circuits is switched to allow a plurality of output signals with different frequency dividing ratios to be output.

SUMMARY OF THE INVENTION

However, to output a plurality of output signals with different frequency dividing ratios, the conventional frequency dividers switch connection paths to the plurality of frequency dividing circuits connected together in series to allow a plurality of output signals with frequency dividing ratios to be output. This requires the provision of at least as many frequency dividing circuits as the number of the frequency dividing ratios to be output.

This results in the need for a plurality of frequency dividing circuits the number of which is equal to or greater than that of the output frequency dividing ratios, increasing costs and the size of the circuit configuration.

The present invention solves the above conventional problems. An object of the present invention is to provide a frequency divider that can output a plurality of different frequency dividing signals using a configuration having a reduced number of frequency dividing circuits, as well as a method for controlling the frequency divider.

To solve the above problems, the first aspect of the present invention is a frequency divider comprising:

a plurality of latch circuits connected together in series and to each of which a clock signal and an inversion clock signal are input;

an inverter circuit to which an output signal from a last connected one of the plurality of latch circuits is input;

an output terminal to which an output from the inverter circuit is connected;

a plurality of feedback paths that allow the output from the inverter circuit to be input to respective inputs of the plurality of latch circuits; and a switching circuit that switches connections to the plurality of the feedback paths so that an output signal from the inverter circuit is input to only one of the plurality of latch circuits.

Further, the second aspect of the present invention is a frequency divider comprising:

a plurality of latch circuits connected together in series and to each of which a clock signal and an inversion clock signal are input;

an inverter circuit to which an output signal from a last connected one of the plurality of latch circuits is input;

an output terminal to which an output from the inverter circuit is connected;

a plurality of feedback paths that allow the output from the inverter circuit to be input to respective inputs of the plurality of latch circuits; and a switching circuit that performs a switching operation such that for each of the plurality of latch circuits except a first connected one, one of an output signal from a latch circuit preceding that latch circuit and an output signal from the inverter circuit is input to an input of that latch circuit.

Further, the third aspect of the present invention is the frequency divider according to the first aspect of the present invention, wherein each of the plurality of latch circuits comprises a transfer gate.

Further, the fourth aspect of the present invention is the frequency divider according to the first aspect of the present invention, wherein each of the plurality of latch circuits comprises a clocked inverter.

Further, the fifth aspect of the present invention is the frequency divider according to the first aspect of the present invention, wherein each of the plurality of latch circuits comprises a clocked CMOS.

Further, the sixth aspect of the present invention is a method for controlling a frequency divider comprising:

a plurality of latch circuits connected together in series and to each of which a clock signal and an inversion clock signal are input;

an inverter circuit to which an output signal from a last connected one of the plurality of latch circuits is input;

an output terminal to which an output from the inverter circuit is connected to output a frequency dividing signal; and a plurality of feedback paths that allow the output from the inverter circuit to be input to respective inputs of the plurality of latch circuits, wherein a switching circuit is used to input the output from the inverter circuit to one of the plurality of latch circuits so that the frequency dividing signal is generated by the latch circuit to which the output has been input, one or more succeeding latch circuits, and the inverter circuit.

Further, the seventh aspect of the present invention is the frequency divider according to the second aspect of the present invention, wherein each of the plurality of latch circuits comprises a transfer gate.

Further, the eighth aspect of the present invention is the frequency divider according to the second aspect of the present invention, wherein each of the plurality of latch circuits comprises a clocked inverter.

Further, the ninth aspect of the present invention is the frequency divider according to the second aspect of the present invention, wherein each of the plurality of latch circuits comprises a clocked CMOS.

The present invention can provide a frequency divider that can output a plurality of different frequency dividing signals using a configuration having a reduced number of frequency dividing circuits, as well as a method for controlling the frequency divider.

Figure 1:
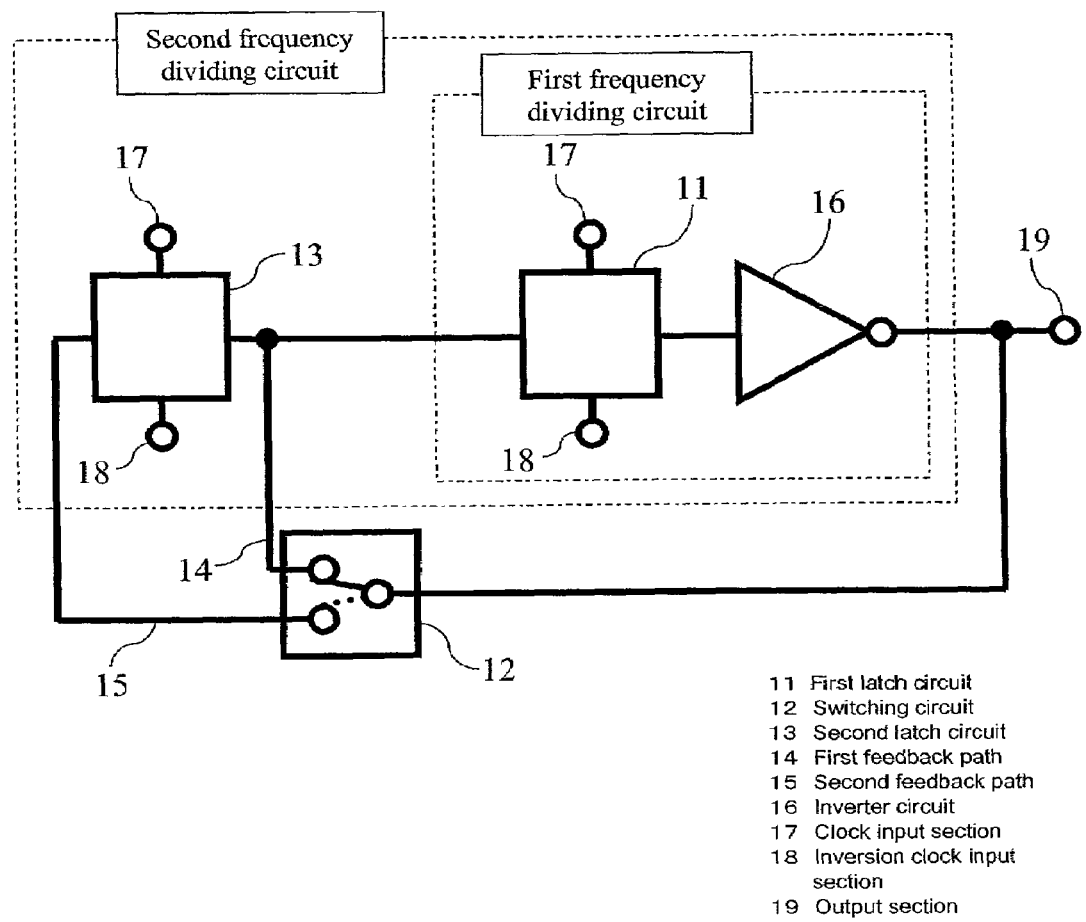
FIG. 1 is a circuit configuration diagram of a frequency divider in accordance with Embodiment 1 of the present invention.

DESCRIPTION OF SYMBOLS 11, 21, 51, 70 First latch circuit
13, 22, 53, 71 Second latch circuit
23, 72 Third latch circuit
12, 20, 52, 83 Switching circuit
73 First switching circuit
74 Second switching circuit
14, 24, 54, 75 First feedback path
15, 25, 56, 76 Second feedback path
26, 77 Third feedback path
55 Second latch circuit output path
16, 27, 57, 78 Inverter circuit
17, 58 Clock input section
18, 59 Inversion clock input section
19, 60 Output section
81, 82 Frequency dividing circuit
84 Input terminal
85 Output terminal
90 Switch
91, 92, 93 Master slave flip flop
94 OR gate
95 Control signal

PREFERRED EMBODIMENT OF THE INVENTION

Embodiments of the present invention will be described below with reference to the drawings.

Embodiment 1

FIG. 1 shows the circuit configuration of a frequency divider in accordance with Embodiment 1 of the present invention.

The frequency divider in accordance with Embodiment 1 comprises a first latch circuit 11, a second latch circuit 13 having an output connected to an input of the first latch circuit 11, and an inverter circuit 16 connected to an output of the first latch circuit 11. Each of the first latch circuit 11 and the second latch circuit 13 has a clock input section 17 to which a clock signal is input and an inversion clock input section 18 to which an inversion clock signal is input.

An output of the inverter circuit 16 is connected to an output section 19. The frequency divider also comprises a first feedback path 14 that connects an output from the inverter circuit 16 to an input of the first latch circuit 11 and a second feedback path 15 that connects the output from the inverter circuit 16 to an input of the second latch circuit 13.

The frequency divider further comprises a switching circuit 12 that switches connections to the first feedback path 14 and the second feedback path 15 in order to connect the output from the inverter circuit 16 to the input of the first latch circuit 11 or the second latch circuit 13.

Now, description will be given of a control method of causing the frequency divider in accordance with Embodiment 1 to output two output signals with different frequency dividing ratios.

First, description will be given of the case in which the switching circuit 12 selects the first feedback path 14 to connect an output from the inverter circuit 16 to the input of the first latch circuit 11.

In this case, a clock signal and an inversion clock signal input to the clock input section 17 and inversion clock input section 18 of the first latch circuit 11 have their frequencies divided by two by a first frequency dividing circuit composed of the first latch circuit 11 and the inverter circuit 16. The resulting frequency signal of the clock input signal divided by two and the resulting frequency signal of the inversion clock signal divided by two are output to the output section 19.

Next, description will be given of the case in which the switching circuit 12 selects the second feedback path 15 to connect the output from the inverter circuit 16 to the input of the second latch circuit 13.

In this case, an output from the second latch circuit 13 is input to the input of the first latch circuit 11.

A clock signal and an inversion clock signal input to the clock input section 17 and inversion clock input section 18 of the second latch circuit 13 have their frequencies divided by four by a second frequency dividing circuit composed of the second latch circuit 13, the first latch circuit 11, and the inverter circuit 16. The resulting frequency signal of the clock input signal divided by four and the resulting frequency signal of the inversion clock signal divided by four are output to the output section 19.

As shown by an alternate long and short dash line in FIG. 1, the frequency divider in accordance with Embodiment 1 has the plurality of frequency dividing circuits using the common output section. The paths inside the frequency divider are switched to allow one of the plurality of frequency dividing circuits to function. This allows a plurality of frequency dividing ratios to be output.

In FIG. 1, the inverter circuit 16 acts as a common output section. The first latch circuit 11 and the inverter circuit 16 constitute a first frequency dividing circuit. The second latch circuit 13, the first latch circuit 11, and the inverter circuit 16 constitute a second frequency dividing circuit.

In the conventional frequency divider, the plurality of frequency dividing circuits are connected together in series so that the connection paths to the frequency dividing circuits can be switched to provide a plurality of frequency dividing ratios. In contrast, in the frequency divider in accordance with Embodiment 1, the paths inside the single frequency divider are switched to provide a plurality of frequency dividing ratios.

Figure 2:
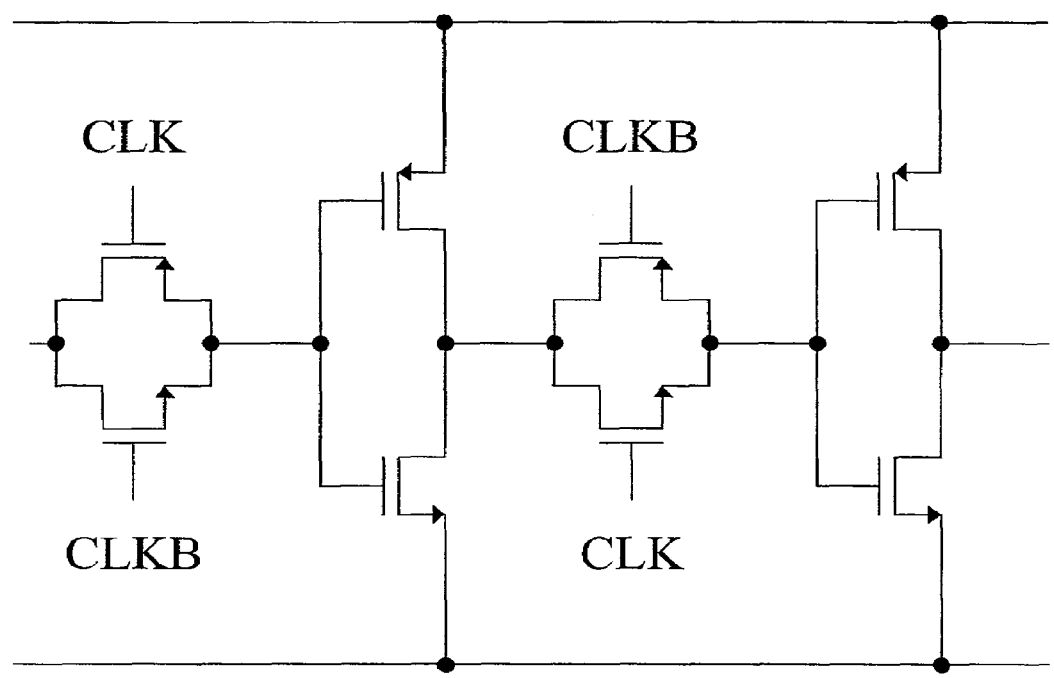
FIG. 2 is a circuit configuration diagram of a transfer gate for use in a latch circuit in the frequency divider in accordance with Embodiment 1 of the present invention.
Figure 3:
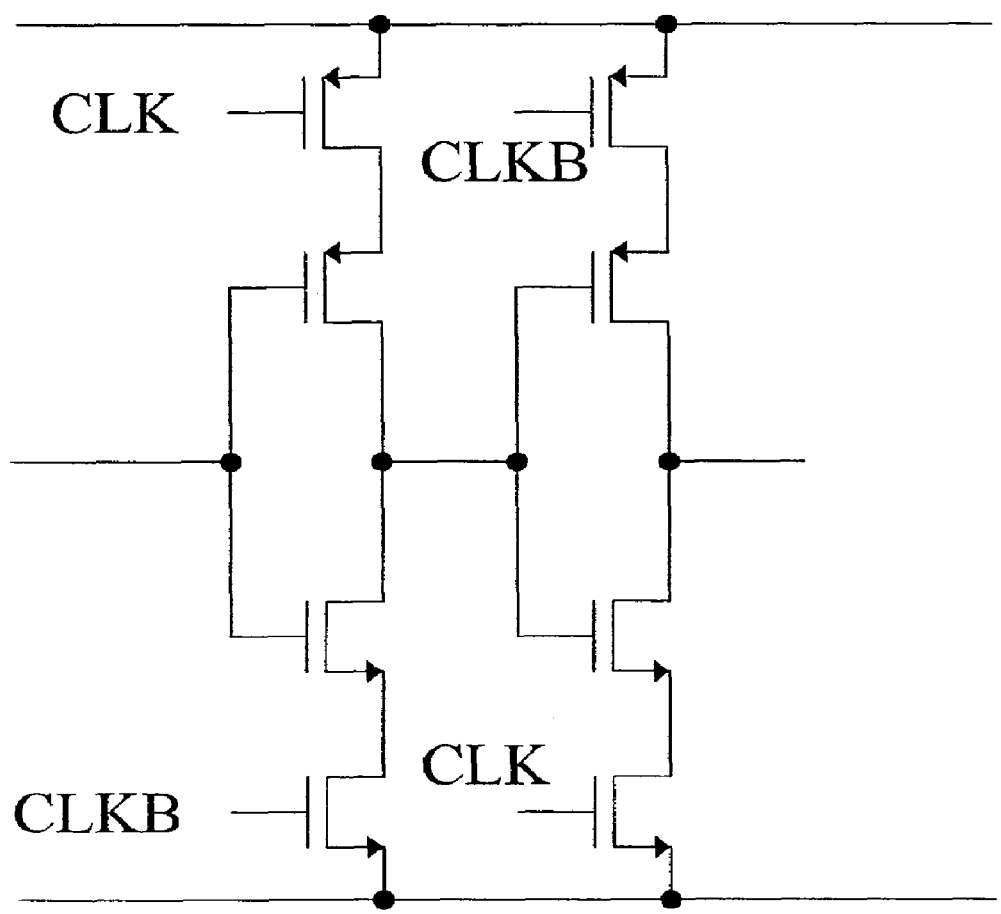
FIG. 3 is a circuit configuration diagram of a clocked inverter for use in the latch circuit in the frequency divider in accordance with Embodiment 1 of the present invention.
Figure 4:
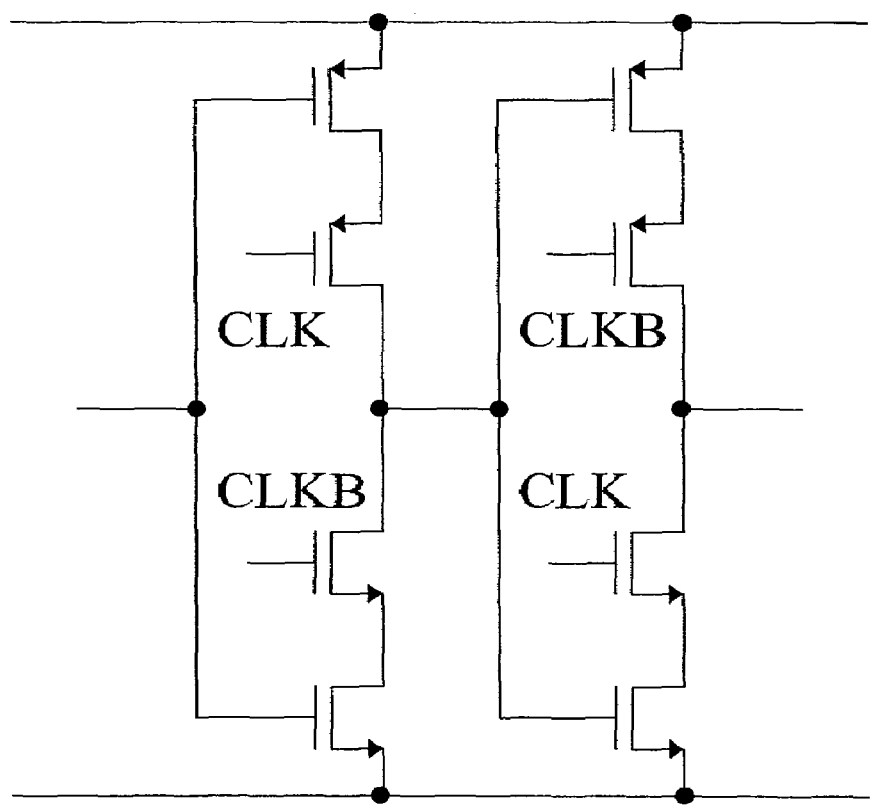
FIG. 4 is a circuit configuration diagram of a clocked CMOS for use in the latch circuit in the frequency divider in accordance with Embodiment 1 of the present invention.

FIGS. 2, 3, and 4 show respective circuit configuration examples of the latch circuit for use in the frequency divider in accordance with Embodiment 1.

FIG. 2 shows a transfer gate circuit. FIG. 3 shows a clocked inverter circuit. FIG. 4 shows a clocked CMOS circuit.

Each of these circuit configurations can be used as the first latch circuit 11 or second latch circuit 13 in the frequency divider shown in FIG. 1.

Embodiment 1 has been described taking the case of the circuit dividing the frequency by two, as the first latch circuit 11 and the second latch circuit 13. However, each of the latch circuits may divide the frequency by bigger value. For example, a plurality of circuits configured as shown in FIGS. 2 to 4 may be connected together in series and used as the first latch circuit 11 or the second latch circuit 13 in FIG. 1. In this case, a clock signal and an inversion clock signal need to be input only to a first circuit configuration part of the circuit configuration having a plurality of arrangements shown in FIGS. 2 to 4 connected in series, connected to the input of the latch circuit; neither the clock signal nor the inversion clock signal needs to be input to the subsequent circuit portions of that latch circuit.

Further, power supply to the latch circuit to which no signals are input may be blocked.

For example, in the frequency divider configured as shown in FIG. 1, when the switching circuit 12 connects an output from the inverter circuit 16 to the input of the first latch circuit 11 via the first feedback path 14 to allow the first frequency dividing circuit to generate frequency dividing signals, the power supply to the second latch circuit 13 may be blocked. This enables a reduction in power consumption.

Further, the power supply voltages of the latch circuits to which signals are input may be varied relative to each other. For example, in the frequency divider configured as shown in FIG. 1, when the first frequency dividing circuit generates frequency dividing signals as described above, the power supply voltage of the first latch circuit 11 may be set at 2 V, whereas the power supply voltage of the second latch circuit 13 may be set at 1.5 V. Thus varying the power supply voltages of the latch circuits relative to each other also enables a reduction in power consumption.

Further, FIG. 1 has been described taking the case in which the frequency divider comprises the two latch circuits. However, the present invention is not limited to this. Increasing the number of latch circuits makes it possible to deal with the larger number of frequency divisions.

Figure 5:
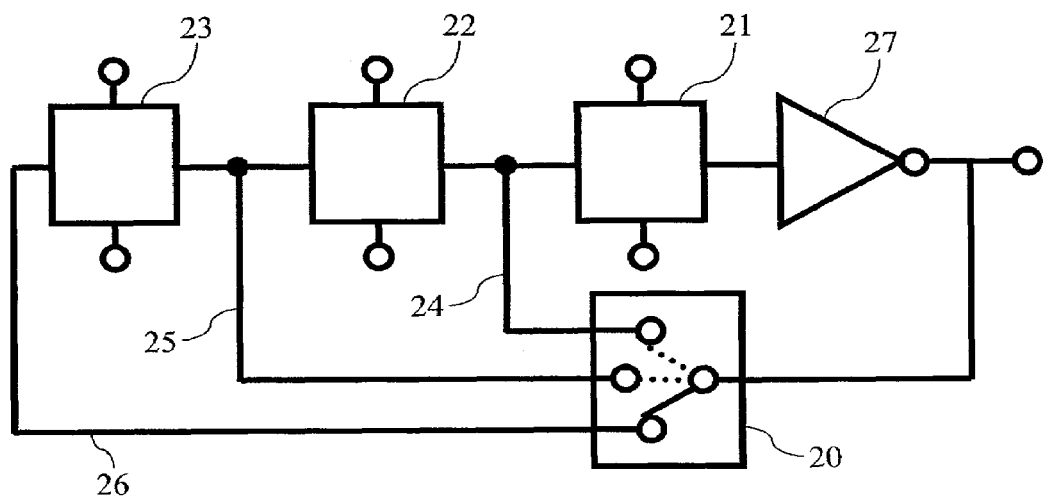
FIG. 5 is a circuit configuration diagram of the frequency dividing circuit in accordance with Embodiment 1 of the present invention which is configured to implement three types of frequency dividing ratios.

FIG. 5 shows an example of the circuit configuration of the frequency divider in accordance with Embodiment 1 which is configured to provide three types of frequency dividing ratios.

The frequency divider has three latch circuits 21, 22, 23 connected together in series, and feedback paths 24, 25, 26 that connect an output from the inverter circuit 27 to inputs of the latch circuits 21, 22, 23, respectively. A switching circuit 20 performs a switching operation such that an output from the inverter circuit 27 is input to one of the three latch circuits 21, 22, 23 so as to switch among the three types of frequency dividing circuit configurations and provide one of the three types of frequency dividing ratios.

Moreover, addition of the arrangement of a frequency dividing circuit provided in the frequency divider allows the single frequency divider to provide more frequency dividing ratios.

Embodiment 2

Figure 6:
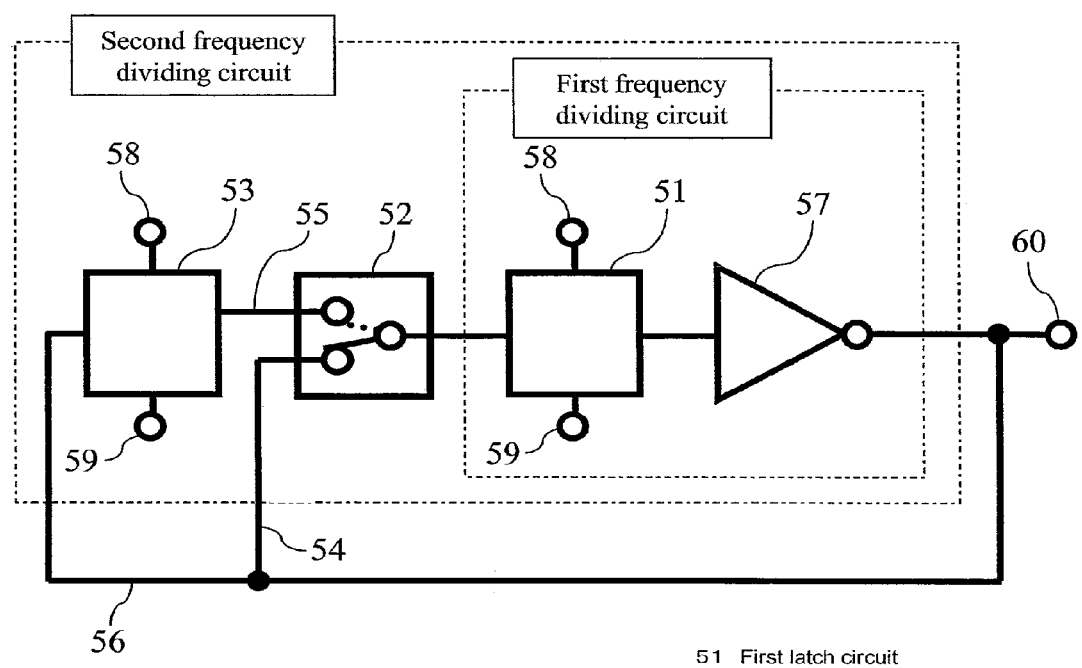
FIG. 6 is a circuit configuration diagram of a frequency divider in accordance with Embodiment 2 of the present invention.

FIG. 6 shows the circuit configuration of a frequency divider in accordance with Embodiment 2 of the present invention.

The frequency divider in accordance with Embodiment 2 comprises a first latch circuit 51, a second latch circuit 53, and an inverter circuit 57 connected to an output of the first latch circuit 51. Each of the first latch circuit 51 and the second latch circuit 53 has a clock input section 58 to which a clock signal is input and an inversion clock input section 59 to which an inversion clock signal is input.

An output of the inverter circuit 57 is connected to an output section 60. The frequency divider also comprises a first feedback path 54 that connects an output from the inverter circuit 57 to an input of the first latch circuit 51 and a second feedback path 56 that connects the output from the inverter circuit 57 to an input of the second latch circuit 53.

The frequency divider further comprises a switching circuit 52 that switches connections so that the first feedback path 54 or the second latch circuit output path 55 is connected to the input of the first latch circuit 51.

Now, description will be given of the case in which the switching circuit 52 selects the first feedback path 54 to connect an output from the inverter circuit 57 to the input of the first latch circuit 51.

In this case, a clock signal and an inversion clock signal input to the clock input section 58 and inversion clock input section 59 of the first latch circuit 51 have their frequencies divided by two by a first frequency dividing circuit composed of the first latch circuit 51 and the inverter circuit 57. The resulting frequency signal of the clock input signal divided by two and the resulting frequency signal of the inversion clock signal divided by two are output to the output section 60.

Now, description will be given of the case in which the switching circuit 52 selects the second latch circuit output path 55 to connect an output from the second latch circuit 53 to the input of the first latch circuit 51.

In this case, an output from the inverter circuit 57 is input to the second latch circuit 53 via the second feedback path 56.

A clock signal and an inversion clock signal input to the clock input section 58 and inversion clock input section 59 of the second latch circuit 53 have their frequencies divided by four by a second frequency dividing circuit composed of the second latch circuit 53, the first latch circuit 51, and the inverter circuit 57. The resulting frequency signal of the clock input signal divided by four and the resulting frequency signal of the inversion clock signal divided by four are output to the output section 60.

As shown by an alternate long and short dash line in FIG. 6, the frequency divider in accordance with Embodiment 2 has the plurality of frequency dividing circuits using the common output section. The paths inside the frequency divider are switched to allow one of the plurality of frequency dividing circuits to function. This allows a plurality of frequency dividing ratios to be output.

In FIG. 6, the inverter circuit 57 acts as a common output section. The first latch circuit 51 and the inverter circuit 57 constitute a first frequency dividing circuit. The second latch circuit 53, the first latch circuit 51, and the inverter circuit 57 constitute a second frequency dividing circuit.

In the conventional frequency divider, the plurality of frequency dividing circuits are connected together in series so that the connection paths to the frequency dividing circuits can be switched to provide a plurality of frequency dividing ratios. In contrast, in the frequency divider in accordance with the Embodiment 2, the paths inside the single frequency divider are switched to provide a plurality of frequency dividing ratios.

Also for the frequency divider in accordance with Embodiment 2, any of the circuits shown in FIGS. 2 to 4 may be used as the first latch circuit 51 or the second latch circuit 53 and a circuit configuration having the plurality of circuit arrangements shown in FIGS. 2 to 4 connected in series may be used.

Further, if the latch circuit uses the configuration having the plurality of circuit arrangements shown in FIGS. 2 to 4 connected in series, a clock signal and an inversion clock signal need to be input only to a first circuit configuration part of the circuit configuration having the plurality of arrangements shown in FIGS. 2 to 4 connected in series, connected to the input of the latch circuit; neither the clock signal nor the inversion clock signal needs to be input to the subsequent circuit portions of that latch circuit.

Further, power supply to the latch circuit to which no signals are input may be blocked.

For example, in the frequency divider configured as shown in FIG. 6, when the switching circuit 52 connects an output from the inverter circuit 57 to the input of the first latch circuit 51 via the first feedback path 54 to allow the first frequency dividing circuit to generate frequency dividing signals, the power supply to the second latch circuit 53 may be blocked. This enables a reduction in power consumption.

Further, the power supply voltages of the latch circuits to which signals are input may be varied relative to each other. For example, in the frequency divider configured as shown in FIG. 6, when the first frequency dividing circuit generates frequency dividing signals as described above, the power supply voltage of the first latch circuit 51 may be set at 2 V, whereas the power supply voltage of the second latch circuit 53 may be set at 1.5 V. Thus varying the power supply voltages of the latch circuits relative to each other also enables a reduction in power consumption.

Further, FIG. 6 has been described taking the case in which the frequency divider comprises the two latch circuits. However, the present invention is not limited to this. Increasing the number of latch circuits makes it possible to deal with the larger number of frequency divisions.

Figure 7:
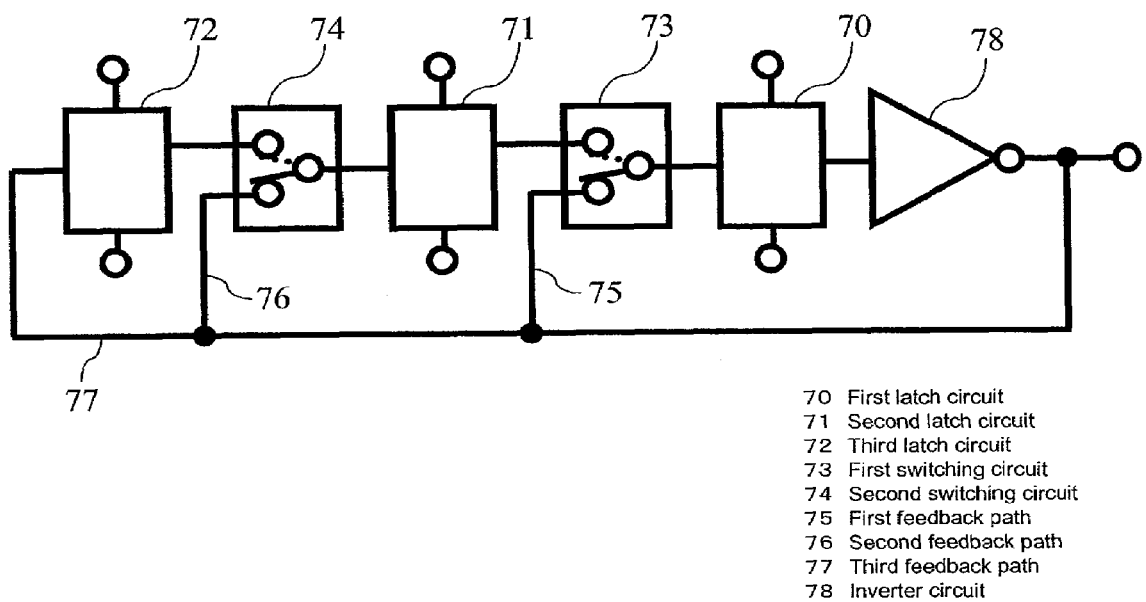
FIG. 7 is a circuit configuration diagram of the frequency dividing circuit in accordance with Embodiment 2 of the present invention which is configured to implement three types of frequency dividing ratios.
Figure 8:
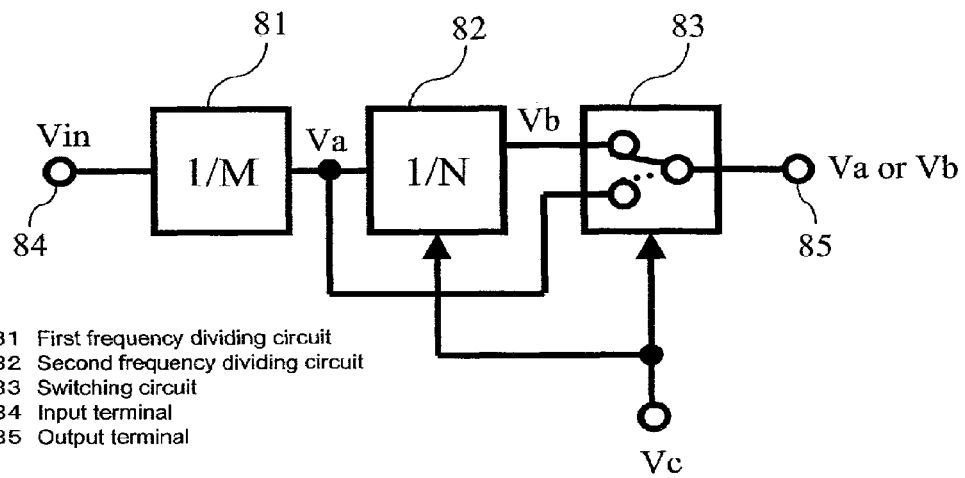
FIG. 8 is a circuit diagram illustrating the basic concept of a conventional frequency divider.
Figure 9:
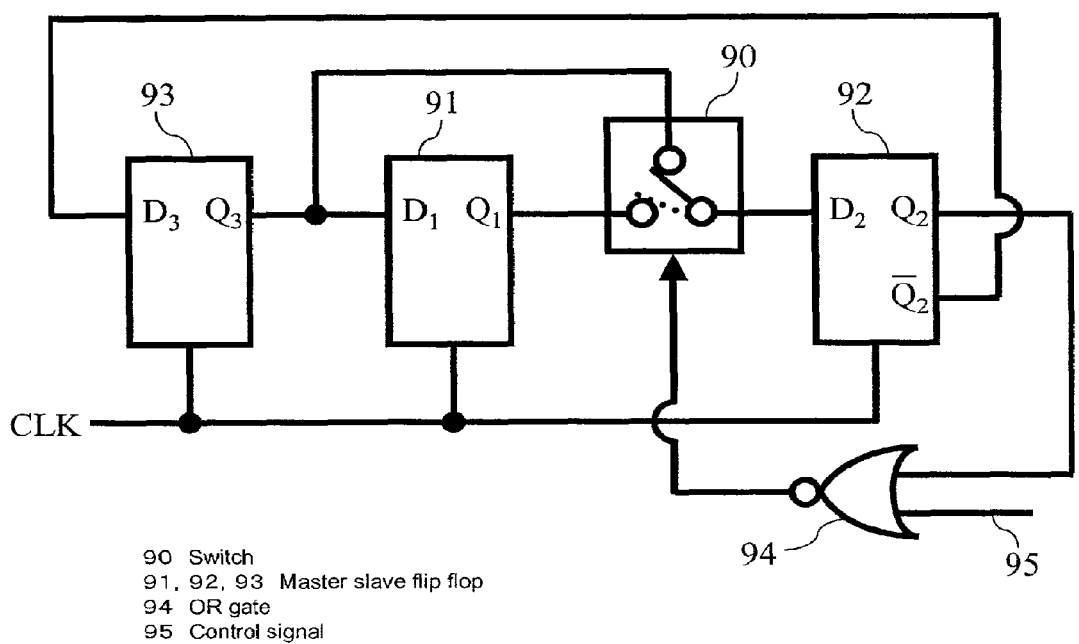
FIG. 9 is a circuit diagram of a conventional frequency divider of another configuration.

FIG. 7 shows an example of the circuit configuration of the frequency divider in accordance with Embodiment 2 which is configured to provide three types of frequency dividing ratios.

The frequency divider has three latch circuits 70, 71, 72 connected together in series, and feedback paths 75, 76, 77 that connect an output from the inverter circuit 78 to inputs of the latch circuits 70, 71, 72, respectively. Switching circuits 73 and 74 perform a switching operation such that an output from the inverter circuit 78 is input to one of the three latch circuits 70, 71, 72 so as to switch among the three types of frequency dividing circuit configurations and provide one of the three types of frequency dividing ratios.

In the frequency divider in accordance with Embodiment 2 configured as shown in FIG. 7, the third latch circuit 72 corresponds to an example of the first connected one of the plurality of latch circuits in accordance with the present invention. Further, examples of the preceding latch circuit in accordance with the present invention are the second latch circuit 71, preceding the first latch circuit 70, and the third latch circuit 72, preceding the second latch circuit 71.

Moreover, more frequency dividing ratio can be provided by adding the arrangement of a frequency dividing circuit provided in the frequency divider and adding a switching circuit to each frequency dividing circuit.

As described above, the use of the frequency divider and the method for controlling the frequency divider in accordance with the present invention enables a plurality of different frequency dividing signals to be output using a configuration having a reduced number of frequency dividing circuits. This makes it possible to provide a frequency divider that is smaller and more inexpensive than the conventional ones.

The frequency divider and the method for controlling the frequency divider in accordance with the present invention effectively enables a plurality of different frequency dividing signals to be output using a configuration having a reduced number of frequency dividing circuits. The frequency divider and the method for controlling the frequency divider in accordance with the present invention are thus useful, for example, for high frequency ICs used in radio communication apparatuses such as cellular phones.

What is claimed is:

1. A frequency divider comprising:
   a plurality of latch circuits connected together in series, each latch circuit configured to receive each of a clock signal and an inversion clock signal;
   an inverter circuit to which an output signal from a last connected one of the plurality of latch circuits is input;
   an output terminal to which an output from the inverter circuit is connected;
   a plurality of feedback paths that allow the output from the inverter circuit to be input to respective inputs of the plurality of latch circuits; and
   a switching circuit that switches connections to the plurality of the feedback paths so that an output signal from the inverter circuit is electrically connected to only one of the plurality of latch circuits, the switching circuit including a number of poles corresponding to the number of latch circuits, wherein the clock signal and the inversion clock signal are input to only one of the plurality of latch circuits.

2. The frequency divider according to claim 1, wherein each of the plurality of latch circuits comprises a transfer gate.

3. The frequency divider according to claim 1, wherein each of the plurality of latch circuits comprises a clocked inverter.

4. The frequency divider according to claim 1, wherein each of the plurality of latch circuits comprises a clocked CMOS.

5. A method for controlling a frequency divider comprising:
   providing an output signal to an inverter circuit from a last connected one of a plurality of latch circuits which are connected together in series, each latch circuit configured to receive each of a clock signal and an inversion clock signal;
   providing a frequency dividing signal from an output terminal to which an output from the inverter circuit is connected;
   providing a plurality of feedback paths to allow the output from the inverter circuit to be input to respective inputs of the plurality of latch circuits;
   providing the clock signal and the inversion clock signal to only one of the plurality of latch circuits; and
   electrically connecting the output from the inverter circuit to one of the plurality of latch circuits via a switching circuit so that the frequency dividing signal is generated by the latch circuit to which the output is electrically connected to, one or more succeeding latch circuits, and the inverter circuit,
   wherein the switching circuit includes a number of poles corresponding to the number of latch circuits.

* * * * *